United States Patent
Ohtou et al.

(10) Patent No.: US 9,570,612 B2
(45) Date of Patent: Feb. 14, 2017

(54) METHOD AND STRUCTURE FOR STRAINING CARRIER CHANNEL IN VERTICAL GATE ALL-AROUND DEVICE

(71) Applicant: Taiwan Semiconductor Manufacturing Company Limited, Hsinchu (TW)

(72) Inventors: Tetsu Ohtou, Hsinchu (TW); Jiun-Peng Wu, Hsinchu (TW); Ching-Wei Tsai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 173 days.

(21) Appl. No.: 14/316,932

(22) Filed: Jun. 27, 2014

(65) Prior Publication Data

US 2015/0380555 A1    Dec. 31, 2015

(51) Int. Cl.
*H01L 29/78*    (2006.01)
*H01L 29/66*    (2006.01)
(Continued)

(52) U.S. Cl.
CPC ........... *H01L 29/7849* (2013.01); *B82Y 10/00* (2013.01); *B82Y 40/00* (2013.01); *H01L 29/0676* (2013.01);
(Continued)

(58) Field of Classification Search
CPC ........... H01L 29/42392; H01L 29/1054; H01L 29/66666; H01L 29/7842; H01L 29/7827; H01L 29/66272; H01L 27/2454; H01L 29/78642
See application file for complete search history.

(56) References Cited

U.S. PATENT DOCUMENTS 7,629,658 B2 * 12/2009 Sugiyama ........... H01F 10/1936
                                                257/421
8,063,450 B2 * 11/2011 Wernersson ........... B82Y 10/00
                                                257/213
(Continued)

FOREIGN PATENT DOCUMENTS

| JP | 2008072104 | 3/2008 |
| JP | 2009239167 | 10/2009 |
| KR | 20070061841 | 6/2007 |
| KR | 20120087069 | 8/2012 |

OTHER PUBLICATIONS

Korean Office Action; Application No. 10-2014-0194650; dated Mar. 14, 2016.
(Continued)

*Primary Examiner* — Bac Au
(74) *Attorney, Agent, or Firm* — Jones Day

(57) ABSTRACT

Method and structure for enhancing channel performance in a vertical gate all-around device, which provides a device comprising: a source region (140); a drain region (190) aligned substantially vertically to the source region; a channel structure (160) bridging between the source region and the drain region and defining a substantially vertical channel direction; and a gate structure (170) arranged vertically between the source region and the drain region and surrounding the channel structure. The channel structure comprises a plurality of channels (161) extending substantially vertically abreast each other, each bridging the source region and the drain region, and at least one stressor (240) interposed between each pair of adjacent channels and extending substantially along the vertical channel direction; the stressor affects lateral strain on the adjacent channels, thereby straining the channels in the vertical channel direction.

20 Claims, 17 Drawing Sheets

(51) Int. Cl.
*B82Y 10/00* (2011.01)
*B82Y 40/00* (2011.01)
*H01L 29/40* (2006.01)
*H01L 29/775* (2006.01)
*H01L 29/06* (2006.01)
*H01L 29/10* (2006.01)
*H01L 29/41* (2006.01)
*H01L 29/423* (2006.01)

(52) U.S. Cl.
CPC ......... *H01L 29/1054* (2013.01); *H01L 29/401* (2013.01); *H01L 29/413* (2013.01); *H01L 29/42376* (2013.01); *H01L 29/66439* (2013.01); *H01L 29/66666* (2013.01); *H01L 29/775* (2013.01); *H01L 29/7827* (2013.01); *H01L 29/42392* (2013.01)

(56) References Cited

U.S. PATENT DOCUMENTS

| | | | |
|---|---|---|---|
| 8,093,127 B2* | 1/2012 | Lee | H01L 29/165 257/E21.41 |
| 8,188,537 B2* | 5/2012 | Masuoka | H01L 21/84 257/329 |
| 9,306,063 B2* | 4/2016 | Doyle | H01L 29/7827 |
| 2003/0116792 A1* | 6/2003 | Chen | B82Y 10/00 257/220 |

OTHER PUBLICATIONS

Korean Notice of Allowance; Application No. 10-2014-0194650; dated Nov. 11, 2016.

* cited by examiner

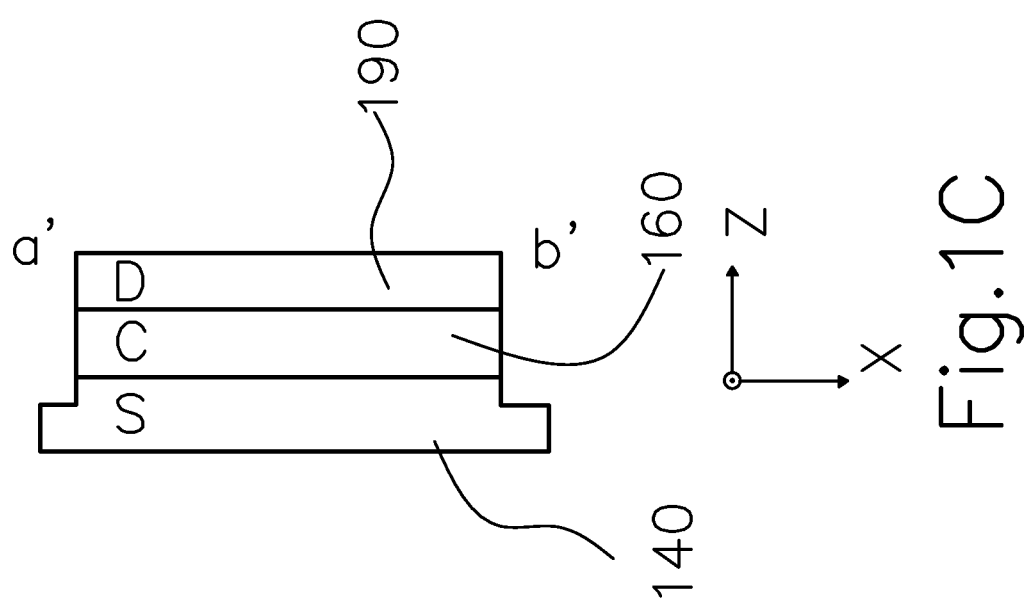

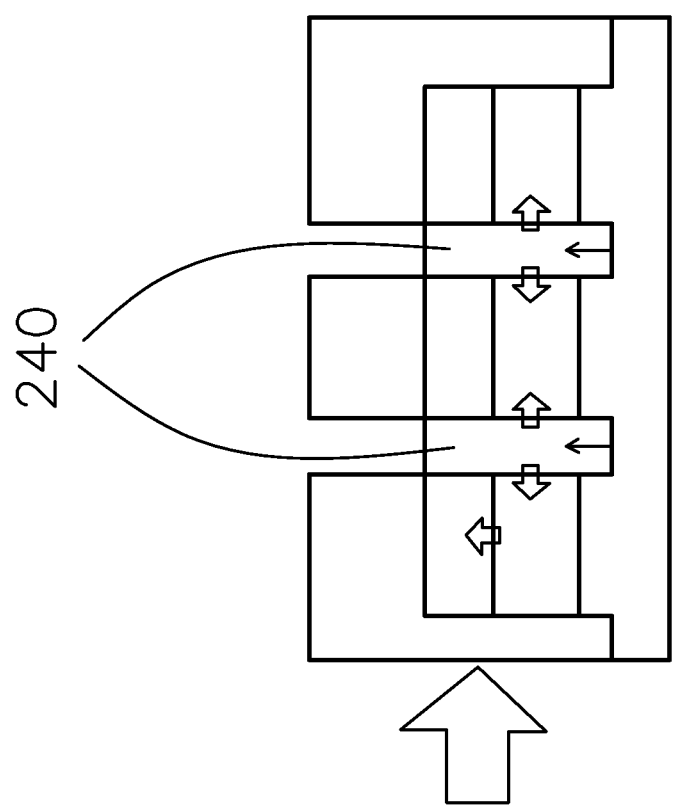

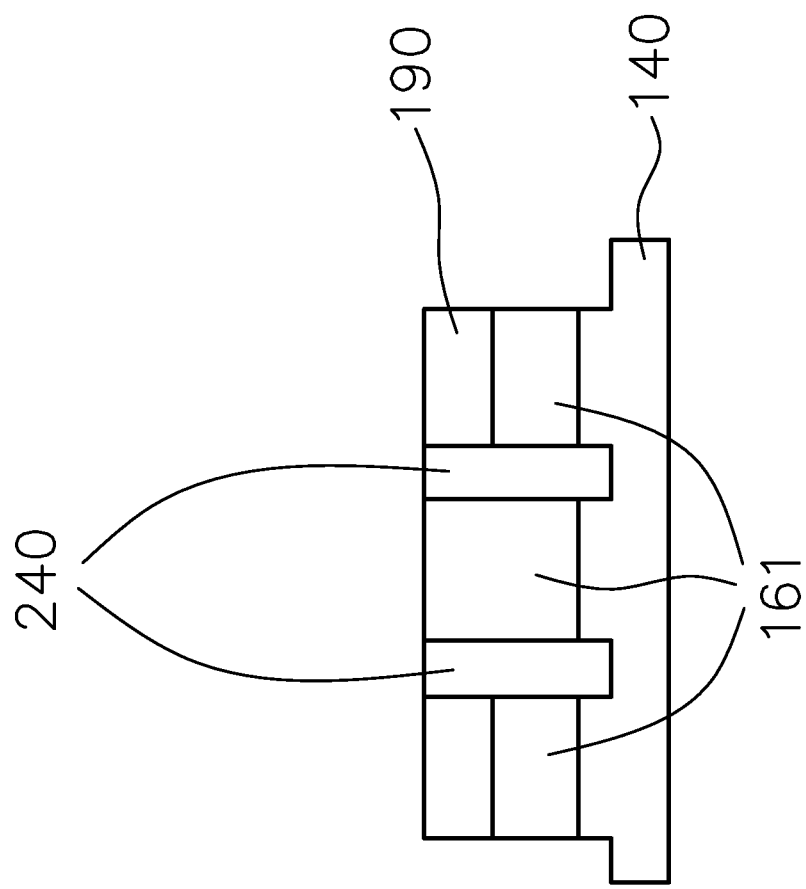

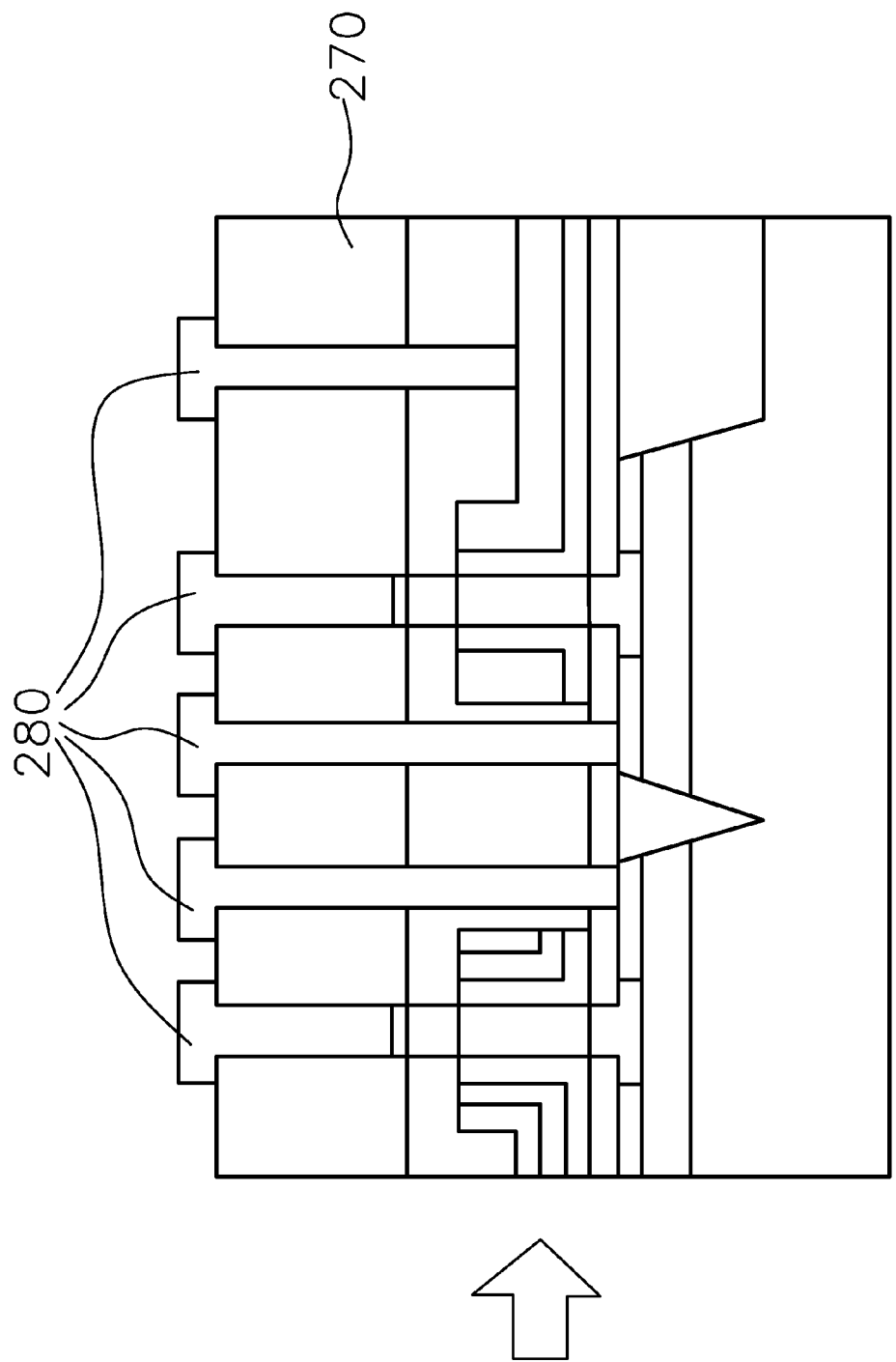

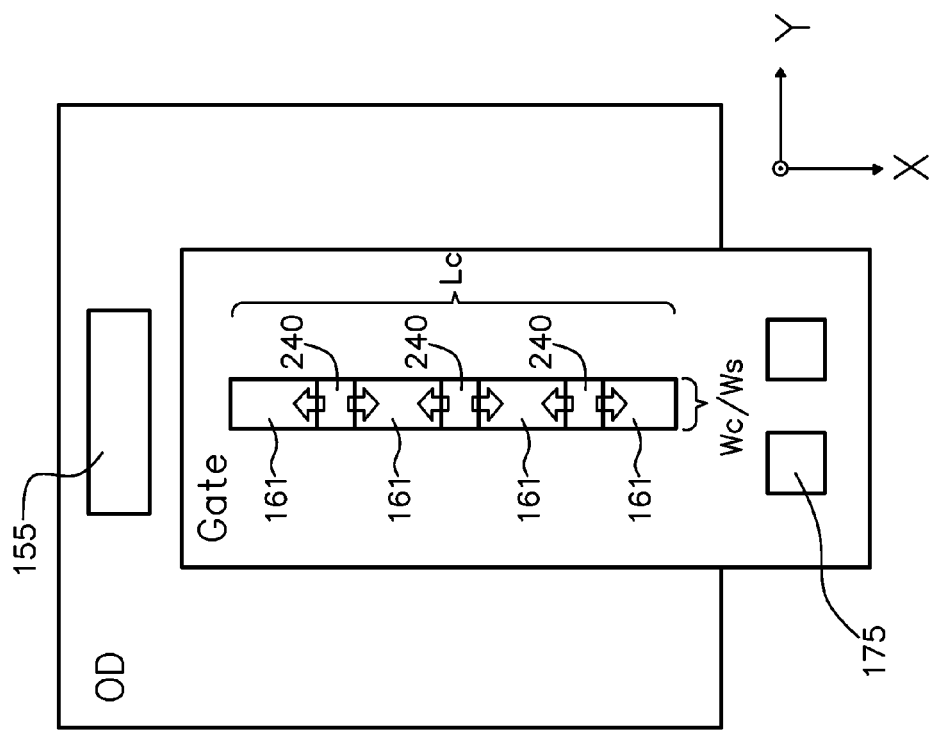

METHOD AND STRUCTURE FOR STRAINING CARRIER CHANNEL IN VERTICAL GATE ALL-AROUND DEVICE

TECHNICAL FIELD

The instant disclosure relates generally to semiconductor devices, and pertains particularly to methods and structures for introducing strain into in a vertical gate all-around (VGAA) device to enhance charge carrier mobility.

BACKGROUND

Channel straining structures and techniques for modern planar devices are generally incompatible with vertical channel devices, such as a vertical gate all-around (VGAA) transistor. It is therefore desirable to provide methods and structures of channel straining suitable for vertical channel devices to boost the performance thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C illustrates a lateral cross-sectional view of the channel structure of the device shown in FIG. 1B, taken along the line a'-b'.

FIGS. 2A-2G illustrate cross-sectional views of a VGAA channel structure at various stages of strain application process in accordance with one embodiment of the instant disclosure.

FIG. 3 illustrates an overhead cross-sectional view of a VGAA device incorporating channel stressors in accordance with one embodiment of the instant disclosure.

FIGS. 6A-6B respectively provide illustrative perspective views of conventional N-channel and P-channel planar MOSFET devices, with indications that show a suitable strain orientations there-for.

FIGS. 7A-7B respectively provide illustrative transverse cross-sectional views of N-channel and P-channel vertical gate all-around (VGAA) MOSFET devices, with indications that show a suitable strain orientations there-for.

DETAILED DESCRIPTION

Figure 1A:
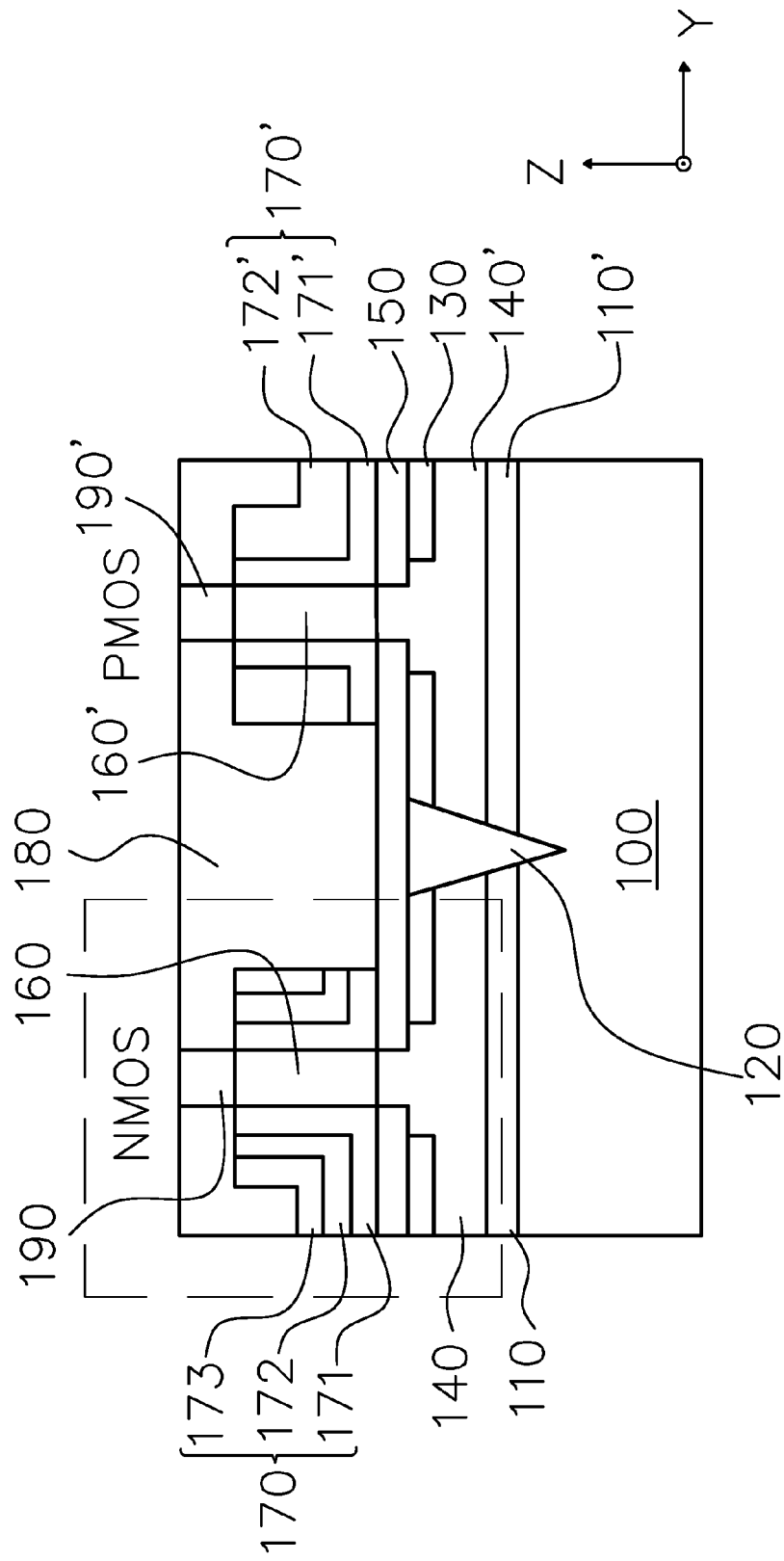
FIG. 1A shows an lateral cross-sectional view of an exemplary device that employs vertical all-around gates.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 6A:
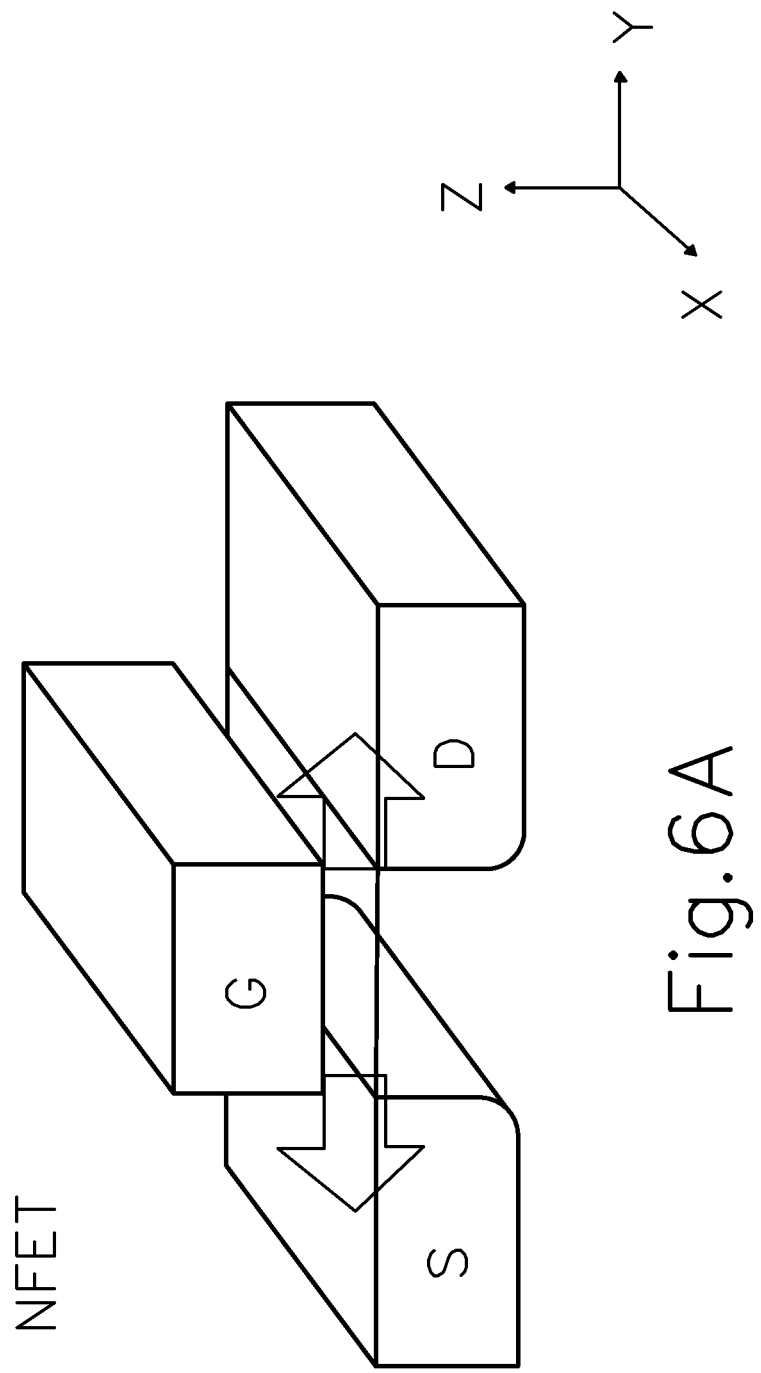
Figure 6B:
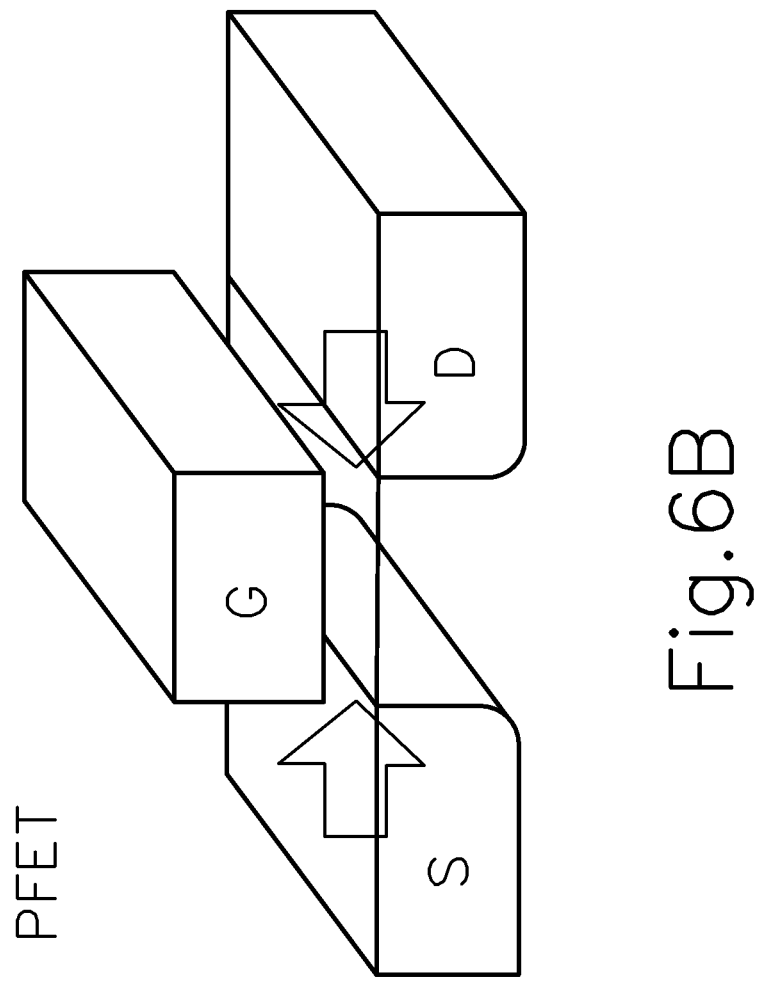

FIGS. 6A and 6B illustrate the suitable straining orientations for conventional planar metal oxide semiconductor field effect transistor (MOSFET) devices, in which the source (S) and drain (D) are configured laterally opposing each other with a channel region defined horizontally therebetween (across the X-Y plane). A gate (G) is arranged between the source (S) and drain (D) above the channel region. Such configuration defines a horizontal charge carrier channel between the source and drain having a longitudinal orientation along the Y-axis. In such a conventional device, strain has to be applied along the horizontal channel direction in order to attain optimal enhancement in the charge carrier mobility performance. For an N-channel (N-FET) device (as shown by FIG. 6A), an outwardly stretching tensile strain (as illustrated by the pair of outwardly-pointing arrows) would contribute to mobility enhancement of the negatively charged carriers (namely, electrons). In contrast, for a P-channel (P-FET) device (as shown by FIG. 6B), an inwardly squeezing compressive strain (as illustrated by the pair of inwardly-pointing arrows) is applied for the mobility enhancement of the positive charge carriers (namely, holes).

Various methods and techniques have been developed to provide strains of suitable orientation for the horizontal/planar architecture. Conventional measures generally include the substrate-strain based and the process-induced strain based systems. An example of the substrate-strain based system is the utilization of a virtual SiGe layer in a substrate, which forces the introduction of a planar biaxial tensile strain in the subsequently disposed silicon through lattice mismatch. An example of the process-induced strain based system is the selective implantation of silicon germanium (SiGe) into the source and drain regions of a conventional planar device; by utilizing the lattice mismatch between the SiGe source/drain regions and the silicon channel, an uniaxial compressive strain can be introduced in the horizontal channel.

Figure 7A:
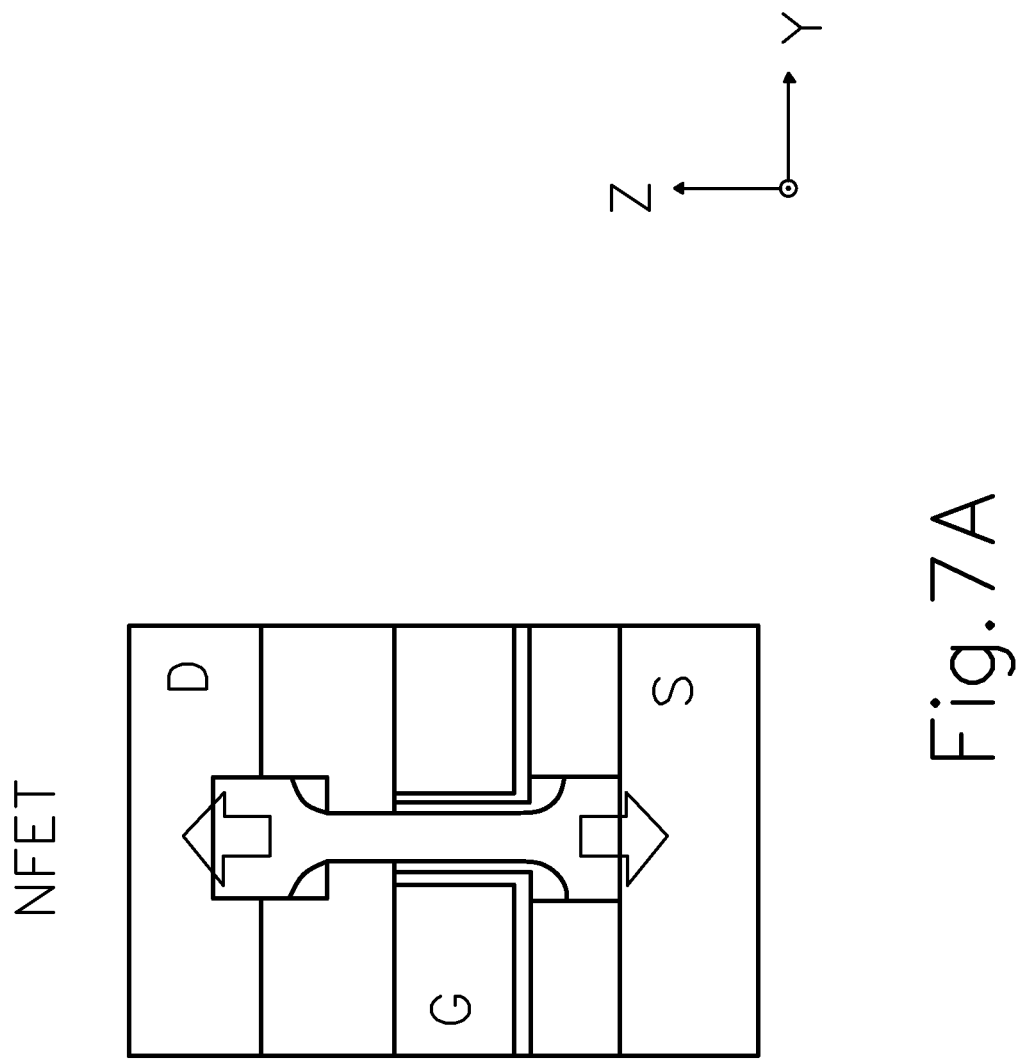
Figure 7B:
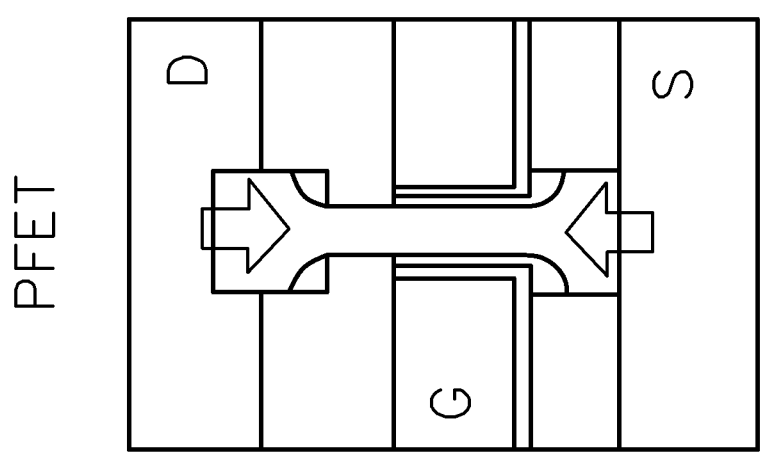

Please refer to FIGS. 7A and 7B, which respectively illustrate transverse cross-sectional views of an N-channel and a P-channel vertical gate all-around (VGAA) transistor devices (with the pairs of arrows indicating a suitable strain orientations). As can be seen, while the conventional channel straining techniques work wonders in boosting the performance of modern planar devices, they are generally not compatible with newer transistor architectures, such as the vertical gate all-around (VGAA) devices.

For the ease and accuracy of orientation referral, a x-y-z coordinate reference is now provided, in which the x-axis is orientated generally in alignment with the horizontal longitudinal direction of a channel structure, the y-axis is oriented generally along the horizontal transverse direction of the device, while the z-axis is oriented generally along the vertical direction with respect to the planar surface of a substrate.

Please refer to FIG. 1A, which shows an lateral transverse cross-sectional view (in the y-z plane) of an exemplary device that employs vertical all-around gate arrangements. The exemplary device may be a integrated circuit (IC) component that incorporates complementary metal oxide semiconductor (CMOS) technology, whose typical digital design utilizes complementary and substantially symmetrical pairs of p-type and n-type metal oxide semiconductor field effect transistors (MOSFETs) for logic functions. As shown in FIG. 1A, the exemplary device employs an n-type metal oxide semiconductor field effect transistor (as denoted by NMOS in the figure) on the left hand side, and a p-type metal oxide semiconductor field effect transistor (as denoted by PMOS in the figure) on the right hand side, separated structurally and electronically by a shallow trench isolation (STI) structure (120).

As shown in FIG. 1A, the exemplary CMOS device comprises a substrate (100) upon which other structural components are built. The substrate (100) may comprise a crystalline silicon substrate (e.g., wafer). The substrate (100) may comprise various doped regions depending on design requirements (e.g., p-type substrate or n-type substrate). For example, the exemplary device shown in the instant figure comprises a positively doped region, i.e., p-well (110) and a negatively doped region, i.e., n-well (110') situating substantially symmetrically at opposite lateral sides of the STI structure (120). The doped regions may be doped with p-type dopants, such as boron or $BF_2$; n-type dopants, such as phosphorus or arsenic; and/or combinations thereof. The selection of dopants in these regions may be interchangeable to suit a particular characteristic of the device to be built (e.g., NMOSFET or PMOSTFT). In some alternative embodiments, the substrate (100) may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate (100) may include an epitaxial layer (epi-layer) and/or may include a silicon-on-insulator (SOI) structure.

The NMOS device illustrated in the instant example (as enclosed in the dashed box) utilizes the vertical gate all-around (VGAA) configuration. The VGAA device as illustrated incorporates a new design architecture, in which the source and drain regions are arranged substantially aligned and substantially perpendicular with respect to the planar surface of the wafer/substrate. The channel structure of the transistor device extends substantially vertically, bridging between the source and the drain, defining a vertical channel direction. The channel structure is made up of at least one (and often more) vertically extending low-profile passageways. In some embodiments, the low-profile passageways of the channel structure are made up of an array of vertically extending nano-scaled structures such as nanobars/tubes/wires, where these vertically extending nano-passageways have at least a segment thereof being horizontally surrounded by a gate. The gate surrounds all the nano-passageways, which improves the device's ability to control the flow of current.

Referring specifically to the lateral cross-sectional view of FIG. 1A. The sources (140/140') of the transistors are arranged (or drains, as these two electrodes are interchangeable) on the doped regions (110/110') for the NMOSFET and PMOSFET, respectively. A silicide layer (130) is disposed on the doped regions (110/110') and around the lower lateral periphery of the sources (140/140'). A insulating spacer layer (150) is disposed coveringly on the STI structure (120), the silicide layer (130), and portions of the sources (140/140'). In some embodiments, conventional insulating materials such as silicon oxide or nitride would be applicable for forming the spacer layer (150). A pair of channel structures (160/160') are arranged respectively on the source regions (140/140'). A pair of gate structures (170/170') are arranged respectively around the channel structures (160/160') (structural details of the channel structure (160) and the gate structure (170) will be discussed subsequently). Drain regions (190/190') are arranged respectively on the top end of the channel structures (160/160'), and inter-layer dielectric (180) is disposed on and over the spacer layer (150), filling the structural gaps around and between the pair of transistor devices. The inter-layer dielectric (180) may be selected from materials having low dielectric constant k (e.g., as close to 1 as possible) to minimize capacitive coupling ("cross talk") between adjacent metallic structural components.

FIG. 1A represents a VGAA NMOSFET device. The exemplary VGAA NMOSFET device comprises a vertically extending channel structure (160) and a horizontally surrounding gate structure (170) that laterally wraps around the channel structure (160), vertically bridging between the source (140) and drain (190) regions. The vertically extending channel structure (160) defines a substantially vertical channel direction, and the thickness thereof (i.e., channel height ($H_c$)) defines the channel length of the VGAA device. The gate structure (170) comprises a gate dielectric layer (171) disposed on the channel structure (160) around the lateral side wall thereof, and a gate electrode layer (172) disposed laterally over the gate dielectric layer (171). The thickness (i.e., gate height ($H_g$)) of the gate stack (170) defines the gate length of the device. In some embodiments, the height of the gate stack ($H_g$) is arranged to be substantially identical to the height of the vertically arranged source-channel-drain stack, thereby establishing greater lateral coverage of the gate around the channel for better channel control. The components/arrangements of the PMOS device, as shown on the right hand side of FIG. 1A, are substantially symmetrical in structure and comparable in function to the NMOS device enclosed in the dashed box, and therefore are denoted in a similar fashion.

Suitable materials for the gate dielectric layer (171) include, for example, silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The gate dielectric layer (171) may be formed using a suitable process such as atomic layer deposition (ALD), chemical vapor deposition (CVD), physical vapor deposition (PVD), thermal oxidation, UV-ozone oxidation, or combinations thereof. The gate dielectric layer (171) may further comprise an interfacial layer (not shown) to reduce damage between the gate dielectric layer (171) and the lateral contact surface of the channel structure (160). The interfacial layer may comprise silicon oxide.

The gate electrode layer (172) may comprise a single layer or multilayer structure (e.g., with an additional layer (173) as shown in FIG. 1A). The gate electrode layer (172) may comprise polysilicon. Further, the gate electrode layer (172) may be doped polysilicon with uniform or nonuniform doping. In some embodiments, metal gate with high-K dielectric may be applied. In this case, the gate electrode layer (172) may include a metal such as Al, Cu, W, Ti, Ta, TiN, TiAl, TiAlN, TaN, NiSi, CoSi, other conductive materials with a work function compatible with the substrate material, or combinations thereof. The gate electrode layer (172) may be formed using a suitable process such as ALD, CVD, PVD, plating, or combinations thereof.

Compared with the conventional planar device architecture whose carrier channels lay horizontally flat with respect to the planar surface of the substrate, a vertical all-around gate (VGAA) configuration utilized in the instant disclosure presents a significantly smaller horizontal footprint on a wafer. Moreover, the all-around gate structure provides considerable advantages over the conventional planar configuration, one of which being that an all-around gate allows the creation of shorter gates without loss of control on the current through the channel. A shorter channel length and a more efficient low-profile gate structure with strong current control capability would allow for increased device switching speed and operating efficiency.

Figure 1B:
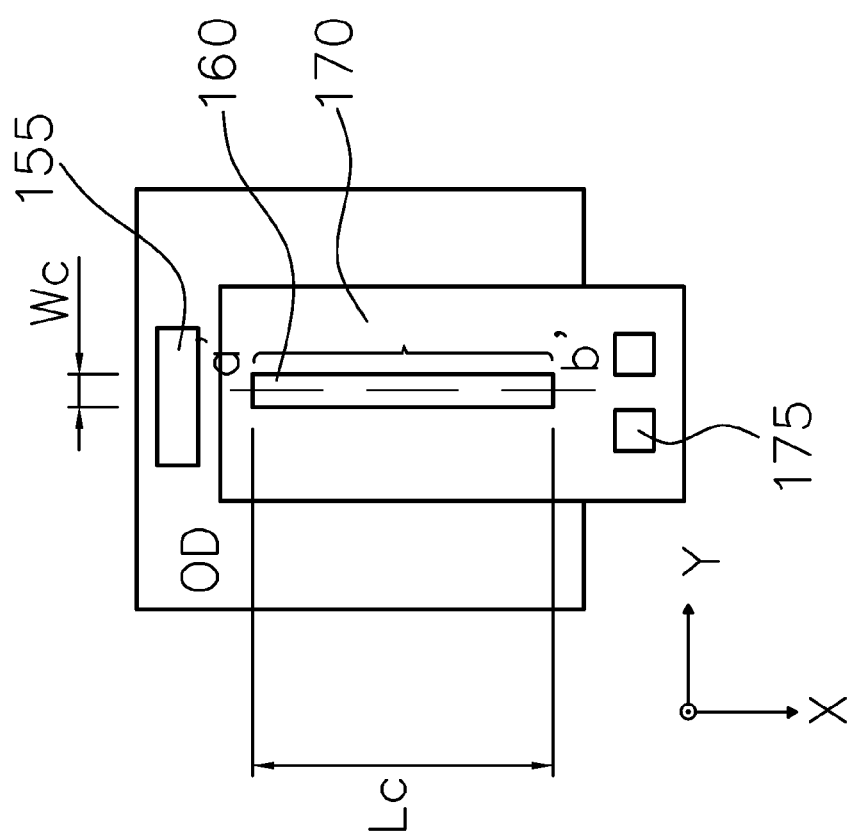
FIG. 1B shows an overhead cross-sectional view of a selected portion of the device shown in FIG. 1A.

FIG. 1B shows an overhead cross-sectional view of a selected portion of the device shown in FIG. 1A (e.g., the region enclosed by the dashed box). As shown in the overhead view of FIG. 1B, the NMOS device, for the most part, are disposed on an oxide diffusion active region (as denoted by "OD"). A gate structure (170) is surroundingly arranged around the channel structure (160). A source contact (155) and a gate contact (175) may be provided for the vertical channel device. The channel structure (160) in the instant embodiment has a substantially rectangular overhead profile that is long and narrow, and extends substantially along the x-axis. However, channel structures having other overhead profile may also be adopted. For instance, some embodiments utilize a channel structure having an overhead profile that resembles substantially a long-oval shape. The channel structure (160) may comprise a nano-scaled structure, such as a nanobar having a lateral length ($L_c$) and a lateral width ($W_c$) as illustrated in FIG. 1B. In some embodiments, the lateral length ($L_C$) of the channel structure (160) may be in the range of about 1 nm to about 10 um, while the lateral width ($W_C$) thereof may be in the range of about 1 nm to about 50 nm. Accordingly, as a perspective visualization, the three dimensional shape of the nano-scaled channel structure (160) in the instant embodiment resembles substantially a thin rectangular plate having a lateral length ($L_c$), a lateral width ($W_c$), and a channel height ($H_c$). In one embodiment, the channel structure (160) comprises a nanobar having a lateral length ($L_c$) of about 250 nm, a lateral width ($W_c$) of about 10 nm, and a channel height ($H_c$) of about 15 nm.

Referring to FIG. 1C, which illustrates a lateral cross-sectional view of the channel structure (160) being sandwiched by the source (140) and the drain (190) regions of the exemplary device, taken along line a'-b' of FIG. 1B. The provision of nanobar may utilize either the bottom-up approach (e.g., by selectively growing of suitable material into a desired nano-scaled structure) or the top-down approach (e.g., by precisely reducing a bulk amount of suitable material down to a desired nano-scaled structure), or suitable combinations thereof. In some embodiments, the nanobar may be obtained by first providing a silicon-based bulk material, doped at proper depth and locations to define the source/drain regions, then precisely etched and reduced to a desirable nano-profile. In some applications, indium gallium arsenide (InGaAs) nanobars may be used because of the better electron mobility they provide.

Please refer to FIGS. 2A-2G, which illustrate cross-sectional views of a VGAA channel structure at various stages of a channel strain application process for performance enhancement in accordance with one embodiment of the instant disclosure.

Figure 2A:
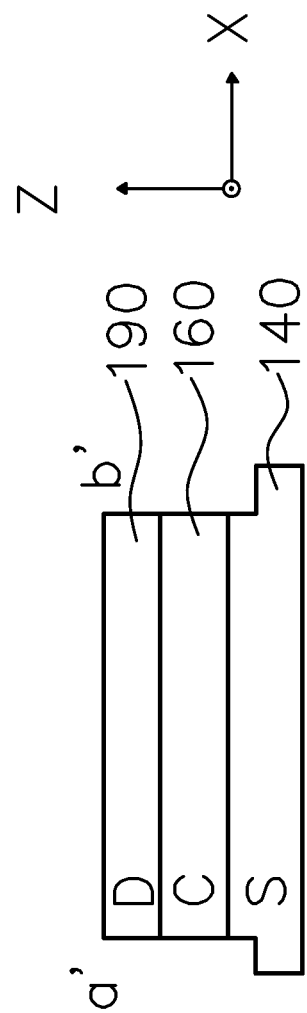

FIG. 2A illustrates a longitudinal lateral cross-section of a channel structure (160) (as depicted in FIG. 1C) on which strain implementation steps will be performed to boost the performance thereof. Upon the formation of the surrounding gate structure (170), the channel straining process is ready to take place.

Figure 2B:
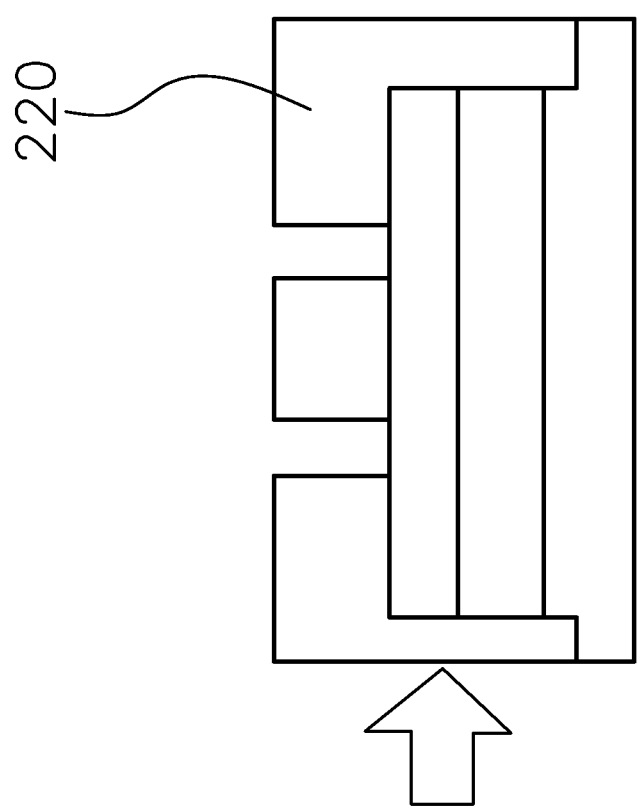

Referring to FIG. 2B, deposition of a hard mask (220) and the patterning thereof is performed for the preparation of selective etching of the channel structure (160). Because the etching process is to be carried out selectively on the long and narrow overhead profile of the nano-scaled channel structure (160) (as shown in FIG. 3B), the patterning of the hard mask (220) would mainly be focusing around the channel structure region, leaving openings primarily on selective locations above the channel structure (160) while protecting the rest of the underlying components.

Figure 2C:
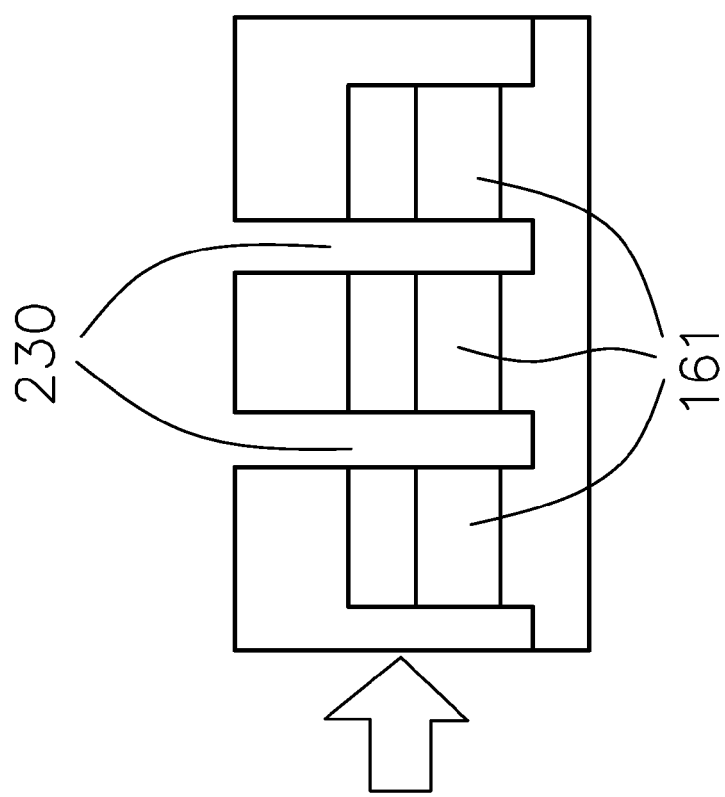

Referring to FIG. 2C, selective etching is performed substantially vertically on the channel structure (160) through the openings in the hard mask (220), forming at least one gap (230) in the channel structure (160). In some embodiments, the vertically excavated gap (230) has a profile that resembles a deep and narrow blind hole having a high aspect ratio, extending from the drain region (190) through the channel region (160) into the source region (140) without penetrating vertically through the source structure. Depending on the lateral length of the channel structure (160) and/or the specific operational requirements of the device, a plurality of gaps (230) having substantially identical structural profile may be provided. As illustrated by the example shown in FIG. 2C, two vertically extending gaps (230) are disposed. In some embodiments, the displacement interval of the gaps (230) are substantially regular along the lateral length of the channel structure (160). Further, in some embodiments, the gap (140) in the channel structure (160) is wide enough to divide the narrow-profiled nano-structure into a plurality of structurally separated channel portions (161) (e.g., the gap width along the y-axis being substantially the same as the channel width ($W_c$) of the channel structure).

As illustrated by the example shown in FIG. 2C, the two vertically extending gaps (230) of substantially identical profile are disposed at substantially regular intervals along the later channel length, diving the channel structure (160) into three structurally separated and substantially identical channel portions (161). One skilled in the art after reading this disclosure will appreciate that other gap placements/dimensional arrangements may be utilized basing on other design considerations and/or specific operational requirements of a device. For instance, for a nano-scaled channel structure whose overhead cross-section is something other than a long and narrow rectangular profile, the gap disposition may be adjusted accordingly to suit the particular device profile arrangement. Moreover, the dimension of the gaps need not be identical in some applications.

Referring to FIG. 2D, a gap-filling process is carried out, in which the vertically extending gaps (230) is filled with one or more suitable material to form channel stressors (240) of suitable characteristics. Materials that are capable of generating lateral strains (e.g., in the lateral longitudinal direction along x-axis) in the channel structure (160) are generally suitable candidates for the process. Further, the gap-filling material may possess good gap-filling properties, as such properties aid the proper filling of a low-profiled, high aspect ratio gap. In one embodiment (as shown in the instant example), the gap-filling material(s) disposed into the gap (230) reaches a height substantially equal to the height of the drain portion (190). In other words, the resultant top surface of the filling is substantially flush with the top surface of the vertically arranged drain portion (190). In other embodiments, the filling is disposed to a height that is greater than that of the drain portion (190), and then recessed back to a substantially flush condition in a later stage of fabrication (as shown in FIG. 6 and FIG. 7, which will be discussed in further detail later).

To boost the performance of an n-type channel device (e.g., a NMOSFET), it is generally desirable to employ gap-fill materials that create lateral compressive/expansion strain in the channel structure (160). For a N-channel device, as the nano-scaled channel structure (160) is surroundingly enclosed by the all-around gate structure (170) in the horizontal x-y plane, the structural rigidity of gate material generally refrains the nanobar channel from expanding laterally outside the boundary defined by the encircling gate structure (170). Therefore, as a gap-filling material having lateral expanding properties is fillingly disposed into the gaps (230) to form the N-type stressor (240), the laterally expanding strain generated there-from (in cooperation with the structural refraining force from the horizontally enclosing gate structure) would cause the nano-scaled channels (161) to stretch substantially vertically along the channel direction (i.e., along the z-axis, in a fashion analogically comparable to squeezing the sidewalls of a toothpaste tube), thereby creating tensile strains in alignment with the vertical channel direction of the transistor device.

As illustrated by FIG. 2D, the vertical nano-channels (e.g., the channel portion 161) of the exemplary n-type channel structure experience lateral compression strain (as indicated by the pair of outward-pointing arrows) from the neighboring interposed stressors (240), and are thus compressed to stretch vertically upward along the z-axis. As a result of the vertically extending tensile strain being in alignment with the vertical channel direction of a vertically arranged nanobar channel structure, the mobility of the charge carrier (in this case, the electrons) may be enhanced. One exemplary material suitable for the fabrication of n-type stressor is silicon germanium (SiGe), as the lattice constant thereof is greater than that of the silicon, therefore is suitable for generating compressive expansion strain in a silicon-based nanobar channel. However, other material (or combination of materials) that exhibits similar properties may also be adapted depending on specific operational requirements or design concerns (such as the choice of material for the nanobar channel).

Conversely, to enhance the performance of a p-type channel device (e.g., a PMOSFET), the opposite would apply. For a p-channel device, it is generally desirable to form p-type stressors using gap-fill materials that create lateral tensile/contraction strain, as the lateral contraction strain from the stressors (in cooperation with the structural bonding force from the surrounding gate structure) would cause the nano-channels (e.g., the channel portion 161) to withdraw substantially vertically along the channel direction (i.e., along the z-axis), thereby creating compressive strains in alignment with the vertical channel direction of the channel structure (160). As a result of the vertically compressive contraction strain being in alignment with the vertical channel direction of a vertically arranged nanobar channel structure, the mobility of the charge carrier (in this case, the holes) may be enhanced. One exemplary material suitable for the fabrication of P-type stressor is silicon carbide (SiC), as the lattice constant thereof is smaller than that of the silicon, therefore is suitable for generating contracting tensile strain in a silicon-based nanobar channel structure. However, other material (or combination of materials) that exhibits similar properties may also be adapted depending on specific operational requirements or design concerns (such as the choice of material for the nanobar channel), as previously discussed.

In one embodiment, as shown in FIG. 2D, the gap-filling material is disposed through epitaxial growth of suitable semiconductor material, such as silicon germanium (SiGe). As discussed previously, the epi-grown silicon germanium stressors (240) would generate lateral expansion strains in the channel structure (160), which in turn causing the desirable vertical tensile strains in the nano-channels (161) for boosting the performance of an N-channel device.

Figure 4:
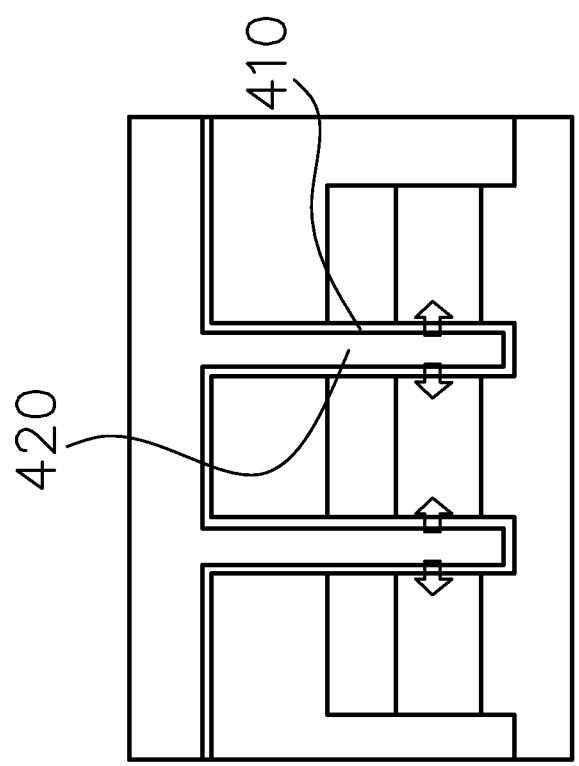
FIGS. 4-5 respectively illustrate exemplary alternative embodiments in accordance with the instant disclosure.

Please refer ahead to FIG. 4. In an alternative embodiment, the gap-filling process is carried out through deposition of a combination of dielectric materials. Specifically, a spacer layer (410) of a first dielectric material is disposed on the exposed surface of the channel structure (160) through the openings defined by the hard mask (220). The coverage of the spacer layer (410) may further include the lateral and bottom surfaces of the source (140) and drain (190) regions that are exposed in and accessible through the vertical gaps (230). The spacer layer (410) provides a thorough coverage of the exposed surface in the gap (230) without filling it. A filling (420) of a second dielectric material is then disposed on the spacer layer (410) to fully fill the gaps in the channel structure (160). The dielectric-filled channel structure (160) is subsequently subjected to annealing to complete the gap-filling process. In some embodiments, the first and the second dielectric materials are silicon dioxide ($SiO_2$) and silicon nitride (SiN), respectively. Like the previous embodiment, the stressors employing this dielectric combination would provide laterally expanding strain in the channel structure (160), thus causing the desirable vertical tensile strains in the nano-channels (161) that may boost the performance of an n-channel device.

Figure 5:
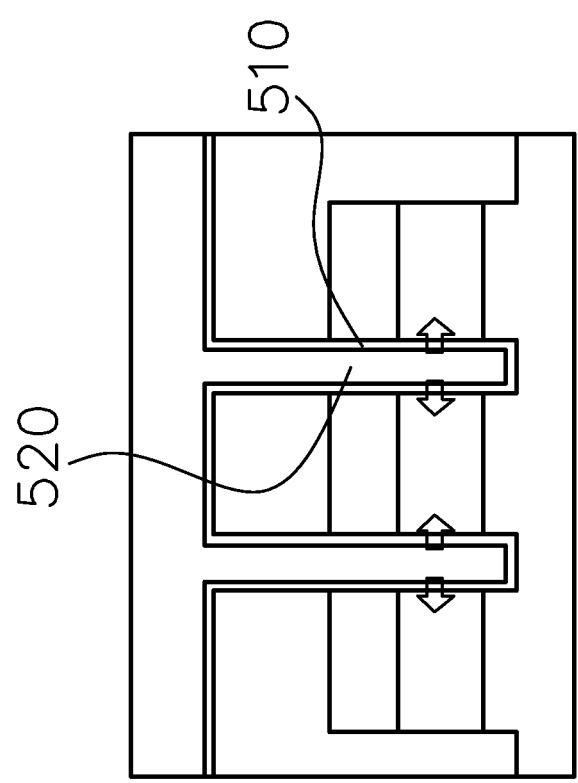

Referring to FIG. 5. In another alternative embodiment, the gap-filling process is carried out through deposition of a combination of dielectric and semiconductor materials. Similar to the previous embodiment, a spacer layer (510) of a silicon dioxide ($SiO_2$) is disposed on the exposed surface of the channel structure (160) through the openings defined by the hard mask (220). The coverage of the spacer layer (510) further includes the lateral and bottom surfaces of the source (140) and drain (190) regions that are exposed in and accessible through the vertical gaps (230). The spacer layer (510) provides a thorough coverage of the exposed surface in the gap (230) without filling it. A filling (520) of a dielectric material (such as poly-SiGe) is then disposed on the spacer layer (510) to fully fill the gaps in the channel structure (160). The fully filled channel structure (160) is subsequently subjected to an oxidation process to form SiGeOx between the nano-channels thereof. In a similar fashion, the SiGeOx between the nano-channels would provide laterally expanding strain in the channel structure (160), thus causing the desirable vertical tensile strains that may boost the performance of an N-channel device.

Referring back to FIG. 2E. Upon the insertion of the gap-filling material in the channel structure (160), a hard mask removal step takes place. A chemical mechanical planarization (CMP) process may be employed to remove the hard mask (220) and expose the top surface of the drain portion (190), providing a resultant structure illustrated by FIG. 2E. Accordingly, the stressors (240) interposed between each pair of adjacent vertical channels (161) are formed.

Figure 2F:
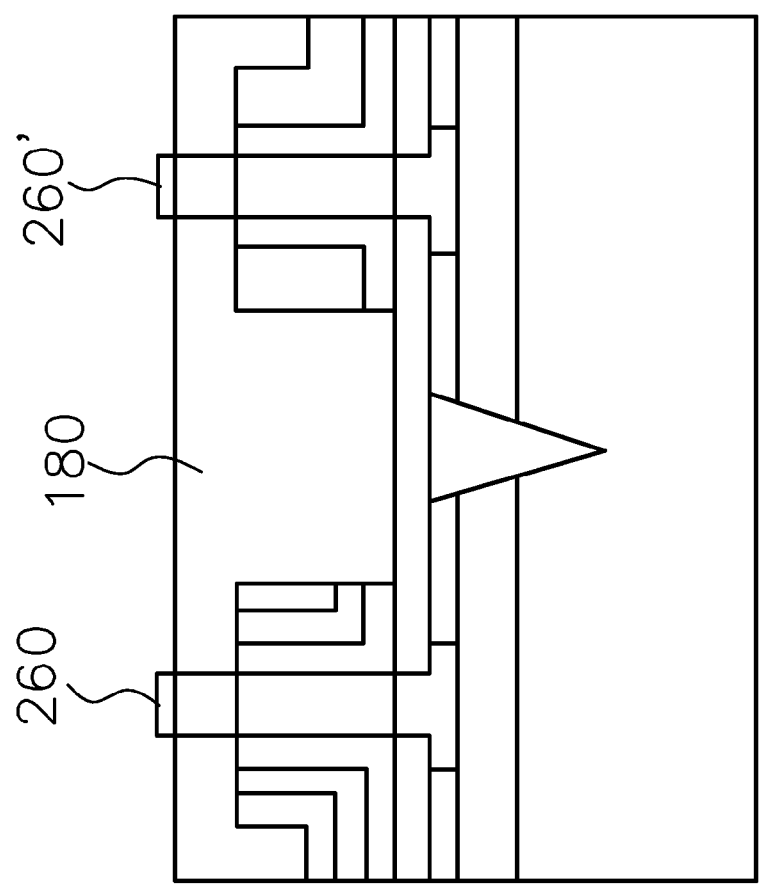

FIG. 2F illustrates a transverse cross-sectional view of the exemplary VGAA CMOS device. As the channel stressors are inserted in place, the formation of drain silicides (260/260') may take place. The drain silicides (260/260') provide the connection interfaces for subsequently formed vias/contacts.

Referring to FIG. 2G. Upon the formation of the drain silicides, further interlayer dielectric (270) is disposed on the existing dielectric layer (180) of the VGAA device. Contacts/vias (280) are than fabricated using viable techniques at suitable locations to enable signal access to the device.

FIG. 3 illustrates an overhead cross-sectional view of a VGAA device incorporating channel stressors in accordance with one embodiment of the instant disclosure. Similar to the overhead view illustrated by FIG. 1B, the overhead cross-sectional view of FIG. 5 shows an exemplary VGAA device having the majority portion thereof disposed on an oxide diffusion active region (as denoted by "OD"). A gate structure (170) is surroundingly arranged around the channel structure (160). A source contact (155) and a gate contact (175) may be provided for the vertical channel device. The channel structure (160) in the instant embodiment has a substantially rectangular overhead profile that is long and narrow, and extends substantially along the x-axis. In some embodiments, the channel structure (160) comprises a nano-bar having a lateral length ($L_c$) in the range of about 1 nm to 10 um, a lateral width ($W_c$) in the range of about 1 nm to about 50 nm, and a vertical height ($H_c$) in the range of about 1 nm to about 100 nm. In the channel structure (160) disposed the vertically extending stressors (240), which are displaced at substantially constant interval along the lateral length ($L_c$), dividing the of the channel structure (160) into a plurality of nano-channels (161). In one embodiment (as shown in FIG. 5), three substantially evenly spaced and structurally identical vertical channel stressors (240) are implemented, each of which has a stressor length ($L_S$) in the range of about 1 nm to about 100 nm, a stressor width ($W_S$) of about 1 nm to about 50 nm (substantially identical to the width of the channel structure ($W_C$), and a stressor height ($H_s$) that substantially matches the height of the source-channel-drain stack. Of course, the specific number and placement of the stressors (240) should be chosen depending on the specific design considerations and/or specific operational requirements of a device, and is therefore not limited to the particular configuration illustrated in the instant exemplary embodiment. Moreover, while the width of the stressor ($W_S$) substantially matches the width of the channel structure ($W_C$) in the instant example, different dimensional arrangements may be adopted in other embodiments. For instance, some embodiments may employ a narrower vertical stressor that does not structurally divide the channel (160) into more than one separated channel portions, while other embodiments may employ a wider vertical stressor whose stressor width ($W_S$) is more than the average width of the channel (160). In some embodiments, a combination of stressors having different dimensions may be utilized.

While the VGAA architecture by itself provides numerous advantages over modern conventional planar devices and enables the continuation of the down-size scaling trend sought by the semiconductor industry, further enhancement in performance is believed to be achievable through the concept of channel straining. However, as the channel direction of a VGAA device being vertically defined along the z-axis from the vertically aligned source and drain regions, conventional planar channel straining techniques (which may include the substrate-based system and/or the process-induced strain based system) are no longer applicable. The method and structure for channel straining in a VGAA device as disclosed herein may provide an reliable and effective solution that is readily compatible to existing fabrication equipment and technology.

Accordingly, one aspect of the instant disclosure provides a semiconductor device, which comprises: a source region; a drain region aligned substantially vertically to the source region; a channel structure bridging between the source region and the drain region and defining a substantially vertical channel direction; and a gate structure arranged vertically between the source region and the drain region and surrounding the channel structure, where the channel structure comprises a plurality of channels extending substantially vertically abreast each other, each bridging the source region and the drain region and at least one stressor interposed between each pair of adjacent channels and extending substantially along the vertical channel direction; the stressor affects lateral strain on the adjacent channels, thereby straining the channels in the vertical channel direction.

Accordingly, another aspect of the instant disclosure provides a method for improving carrier mobility in a semiconductor device, which comprises: in a semiconductor structure comprising a channel structure that defines a substantially vertical channel direction and a gate structure surroundingly arranged around the channel structure, selectively etching the channel structure substantially along the vertical channel direction to form at least one vertically extending gap; and filling the gap with gap-filling material to form at least one vertically extending stressor in the channel structure, wherein the stressor affects lateral strain in the channel structure, thereby straining the channel structure in the vertical direction.

Accordingly, yet another aspect of the instant disclosure provides a strained structure for improving carrier mobility in a vertical gate all-around semiconductor device, which comprises: a channel structure defining a substantially vertical channel direction, the channel structure comprises a plurality of channels extending substantially vertically abreast each other, each bridging a source region and a drain region of the semiconductor device; and at least one stressor interposed between each pair of adjacent channels and extending substantially along the vertical channel direction, wherein the stressor affects lateral strain on the adjacent channels, thereby straining the channels in the vertical direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a source region;
    a drain region aligned substantially vertically to the source region;

a channel structure bridging the source region and the drain region, the channel structure comprising:
    at least one channel portion defining a substantially vertical channel direction, and
    at least one stressor disposed adjacent to the channel portion and extending substantially along the vertical channel direction; and
a gate structure arranged vertically between the source region and the drain region and surrounding the channel structure;
wherein the stressor affects lateral strain on the adjacent channel portion, thereby straining the channel portion in the vertical channel direction.

2. The device of claim 1, wherein the channel structure comprises a nanobar defining a lateral length, a lateral width, and a vertical height.

3. The device of claim 2, wherein the length of the nanobar is in the range of about 1 nm to about 1 um, the width thereof is in the range of about 1 nm to about 50 nm, and the height thereof is in the range of about 1 nm to about 100 nm.

4. The device of claim 1, wherein the stressor has a stressor length in the range of about 1 nm to about 100 nm, and a stressor width substantially matches the width of the channel structure.

5. The device of claim 1, which comprises a plurality of stressors, wherein the plurality of stressors are substantially evenly disposed along the lateral length of the channel structure.

6. The device of claim 1, wherein the stressor provides a lateral compressive strain, thereby causing vertical tensile strain in the channel portion.

7. The device of claim 1, wherein the stressor provides a lateral tensile strain, thereby causing vertical compression strain in the channel portion.

8. A strained structure for improving carrier mobility in a vertical gate all-around semiconductor device, comprising:
a channel structure bridging a source and a drain regions of the semiconductor device, comprising:
    at least one channel portion defining a substantially vertical channel direction; and
    at least one stressor disposed adjacent to the channel portion and extending substantially along the vertical channel direction,
wherein the stressor affects lateral strain on the adjacent channel portion, thereby straining the channel portion in the vertical direction.

9. The structure of claim 8, wherein the channel structure comprises a nanobar defining a lateral length, a lateral width, and a vertical height.

10. The structure of claim 9, wherein the length of the nanobar is in the range of about 1 nm to about 1 um, the width thereof is in the range of about 1 nm to about 50 nm, and the height thereof is in the range of about 1 nm to about 100 nm.

11. The structure of claim 9, wherein the stressor has a stressor length in the range of about 1 nm to about 100 nm, and a stressor width substantially matches the width of the channel structure.

12. The structure of claim 9, which comprises a plurality of stressors, wherein the plurality of stressors are substantially evenly disposed along the lateral length of the channel structure.

13. The structure of claim 9, wherein the stressor provides a lateral compressive strain, thereby causing vertical tensile strain in the channel portion.

14. The structure of claim 9, wherein the stressor provides a lateral tensile strain, thereby causing vertical compression strain in the channel portion.

15. A semiconductor device, comprising:
a channel structure of the semiconductor device comprising:
    at least one channel portion defining a substantially vertical channel direction, and
    at least one stressor disposed adjacent to the channel portion and extending substantially along the vertical channel direction, the stressor straining the channel portion in the vertical channel direction; and
a gate structure surrounding the channel structure.

16. The semiconductor device of claim 15, wherein the channel structure comprises a nanobar defining a lateral length, a lateral width, and a vertical height.

17. The semiconductor device of claim 16, wherein the stressor has a stressor length in the range of about 1 nm to about 100 nm, and a stressor width substantially matches the width of the channel structure.

18. The semiconductor device of claim 16, wherein the at least one stressor comprises a plurality of stressors, and wherein the plurality of stressors are substantially evenly spaced along the lateral length of the channel structure.

19. The semiconductor device of claim 15, wherein the stressor provides a lateral compressive strain, thereby causing vertical tensile strain in the channel portion.

20. The semiconductor device of claim 15, wherein the stressor provides a lateral tensile strain, thereby causing vertical compression strain in the channel portion.

* * * * *